(12) United States Patent
Cho

(10) Patent No.: US 6,240,213 B1
(45) Date of Patent: May 29, 2001

(54) DATA COMPRESSION SYSTEM HAVING A STRING MATCHING MODULE

(75) Inventor: Sung-Ryul Cho, Seoul (KR)

(73) Assignee: Daewoo Electronics Co., Ltd., Seoul (KR)

(*) Notice: Subject to any disclaimer, the term of this patent is extended or adjusted under 35 U.S.C. 154(b) by 0 days.

(21) Appl. No.: 09/210,835

(22) Filed: Dec. 15, 1998

(30) Foreign Application Priority Data

Dec. 20, 1997 (KR) ................................................. 97-71300

(51) Int. Cl.[7] ....................................................... G06K 9/36
(52) U.S. Cl. .............................................................. 382/245
(58) Field of Search ..................................... 382/245, 246; 358/261.1, 427; 341/51–52, 55–78, 106

(56) References Cited

U.S. PATENT DOCUMENTS

| | | |
|---|---|---|
| 4,876,541 | 10/1989 | Storer . |
| 5,151,697 | 9/1992 | Bunton . |
| 5,455,576 * | 10/1995 | Clark, II et al. ........................ 341/50 |
| 5,534,861 * | 7/1996 | Chang et al. .......................... 341/79 |
| 5,703,581 * | 12/1997 | Matias et al. .......................... 341/67 |
| 5,951,623 * | 9/1999 | Reynar et al. ........................ 708/203 |
| 5,955,976 * | 9/1999 | Heath .................................... 341/87 |

FOREIGN PATENT DOCUMENTS 0687995    12/1995    (EP) .

* cited by examiner

Primary Examiner—Joseph Mancuso
Assistant Examiner—Ali Bayat
(74) Attorney, Agent, or Firm—Pennie & Edmonds LLP

(57) ABSTRACT

In a data compression system for compressing an input stream of characters into a compressed stream of codewords by employing a dictionary, wherein the dictionary stores a plurality of entries of characters, each entry being identified by a unique codeword, the input stream of characters is parsed into parsed strings and the unique codeword identifying each parsed string is transmitted. In the meantime, the dictionary is updated with N new entries of characters, wherein all of the N new entries include an unmatched character which is appended to the parsed string so that a new codeword is assigned to each of the N new entries, N being an integer equal to or larger than 0.

9 Claims, 5 Drawing Sheets

FIG.2
(PRIOR ART)

| LEVEL | LONGEST MATCHING STRING | ENTRY ADDED |
|---|---|---|
| 1 | A | AB |
| 2 | B | BA |
| 3 | AB | ABC |
| 4 | C | CB |
| 5 | B | BC |
| 6 | C | CA |
| 7 | ABC | ABCB |
| 8 | BC | BCA |
| 9 | A | AD |
| 10 | D | |

FIG.5

| LEVEL | LONGEST MATCHING STRING | ENTRIES ADDED |
|---|---|---|
| 1 | A | AB |
| 2 | B | BA |
| 3 | AB | ABC , BC |
| 4 | C | CB , |
| 5 | BC | BCA , CA |
| 6 | ABC | ABCB , BCB |
| 7 | BCA | BCAD , CAD , AD |
| 8 | D | |

DATA COMPRESSION SYSTEM HAVING A STRING MATCHING MODULE

FIELD OF THE INVENTION

The present invention relates to a data compression system; and, more particularly, to a data compression system with a string matching module employing a recursive updating algorithm.

DESCRIPTION OF THE PRIOR ART

In general, the available frequency bandwidth of a conventional transmission channel is limited in digitally televised systems. Accordingly, in order to transmit the large amount of digital data therethrough, it is necessary to compress or reduce the volume of data through the use of various data compression techniques.

Although many different data compression techniques are known in the art, one of the most useful is the so-called dictionary-based universal compression techniques. Among these, the most widely used one is a standard coding algorithm, e.g., CCITT (International Telegragh and Telephone Consultative Committee V.42bis), established by CCITT, wherein the standard coding algorithm is developed as a practical technique for compressing data based on the Ziv-Lempel coding algorithm.

In the CCITT V.42bis, an encoding and a decoding apparatus are provided, each having a fixed, finite amount of memory. This memory, also referred to as a "dictionary", contains a finite number of entries of characters. Each entry has a unique codeword associated therewith. The dictionaries at the encoding and the decoding apparatus may be initialized at the beginning to contain identical information.

Referring to FIG. 1, there is illustrated a block diagram of an encoding apparatus 10 used in the conventional data compression system. The encoding apparatus 10 comprises a string matching block 12, a dictionary 14, an entry updating block 16 and an encoder 18.

The string matching block 12 receives an input stream of characters on a character-by-character basis and finds a longest matching string of characters that matches one of a plurality of entries within the dictionary 14. Specifically, a string, i.e., a sequence of characters, is formed from a first character and, if the string matches with an entry of the dictionary, a next character is read and appended to the string so as to repeat this step. If the string matches with no entry within the dictionary, the last character appended to the string is removed to generate the longest matching string of characters, wherein the string shortened represents the longest matching string and the last character represents an unmatched character that does not match.

The encoder 18 detects a codeword of the matched entry within the dictionary 14 identified by the longest matching string and transfers the codeword as an output.

In the meantime, the entry updating block 16 updates a new entry into the dictionary 14 based on the longest matching string in order to maintain an efficient compression, wherein the new entry is formed by appending the longest matching string to the unmatched character resulting from the string matching operation. A new codeword is assigned to the new entry to be stored in the dictionary.

As a result, the dictionary 14 performs the string matching procedure, the string update procedure and the string encoding procedure as described above. If the new entry itself has already been in the dictionary, it will not be added.

Referring to FIG. 2, there is illustrated the manner by which the longest matching string is encoded and the new entry is updated in the conventional data compression system. It is assumed that the dictionary contains characters 'A' to 'Z' with their respective corresponding codewords '0' to '25' as a plurality of entries and an input stream of characters, e.g., 'ABABCBCABCBCAD', is provided. At a 1st level, the first character 'A' of the input stream is matched with the longest matching string 'A' to be encoded as the codeword '0' since the string 'AB' has not been enrolled in the dictionary. Thereafter, the string 'AB', which is generated by linking the longest matching string 'A' to the unmatched character 'B', is enrolled as the new entry with the new codeword '26' in the dictionary. At a 2nd level, the longest matching string 'B' is encoded with the codeword '1' and the new entry 'BA' is enrolled with the new codeword '27' in the dictionary in a similar manner. At next levels, the longest matching strings 'AB', 'C', 'B', 'C', 'ABC', 'BC' and 'A' are sequentially encoded while the new entries 'ABC', 'CB', 'BC', 'CA', 'ABCB', 'BCA' and 'AD' are sequentially enrolled in the dictionary.

Since, however, the compression efficiency in the CCITT V.42bis depends on how the dictionary is updated based on the input stream of characters, it is required that the number of new entries which can be enrolled for each longest matching string increases.

SUMMARY OF THE INVENTION

It is, therefore, a primary object of the present invention to provide a data compression system capable of updating a dictionary therein with one or more entries for each longest matching string associated with a codeword.

In accordance with the present invention, there is provided a data compression system for compressing an input stream of characters into a compressed stream of codewords, comprising:

dictionary means for storing a plurality of entries of characters, each entry being identified by a unique codeword;

matching means for parsing said input stream of characters into a number of parsed strings of characters;

encoder for transmitting the unique codeword identifying each parsed string; and update means for adding N new entries of characters to said dictionary means, wherein all of said N new entries include an unmatched character which is appended to said each parsed string, N being an integer larger than or equal to 0, and assigning a new codeword to each of said N new entries.

BRIEF DESCRIPTION OF THE DRAWINGS

The above and other objects and features of the present invention will become apparent from the following description of preferred embodiments given with reference to the accompanying drawings, in which:

FIG. 2 provides the manner in which the longest matching string is encoded and the new entry is updated in the conventional data compression system;

FIG. 5 shows the manner in which the longest matching string is encoded and one or more new entries are updated in the data compression system in accordance with the present invention.

DETAILED DESCRIPTION OF THE PREFERRED EMBODIMENTS

Figure 1:
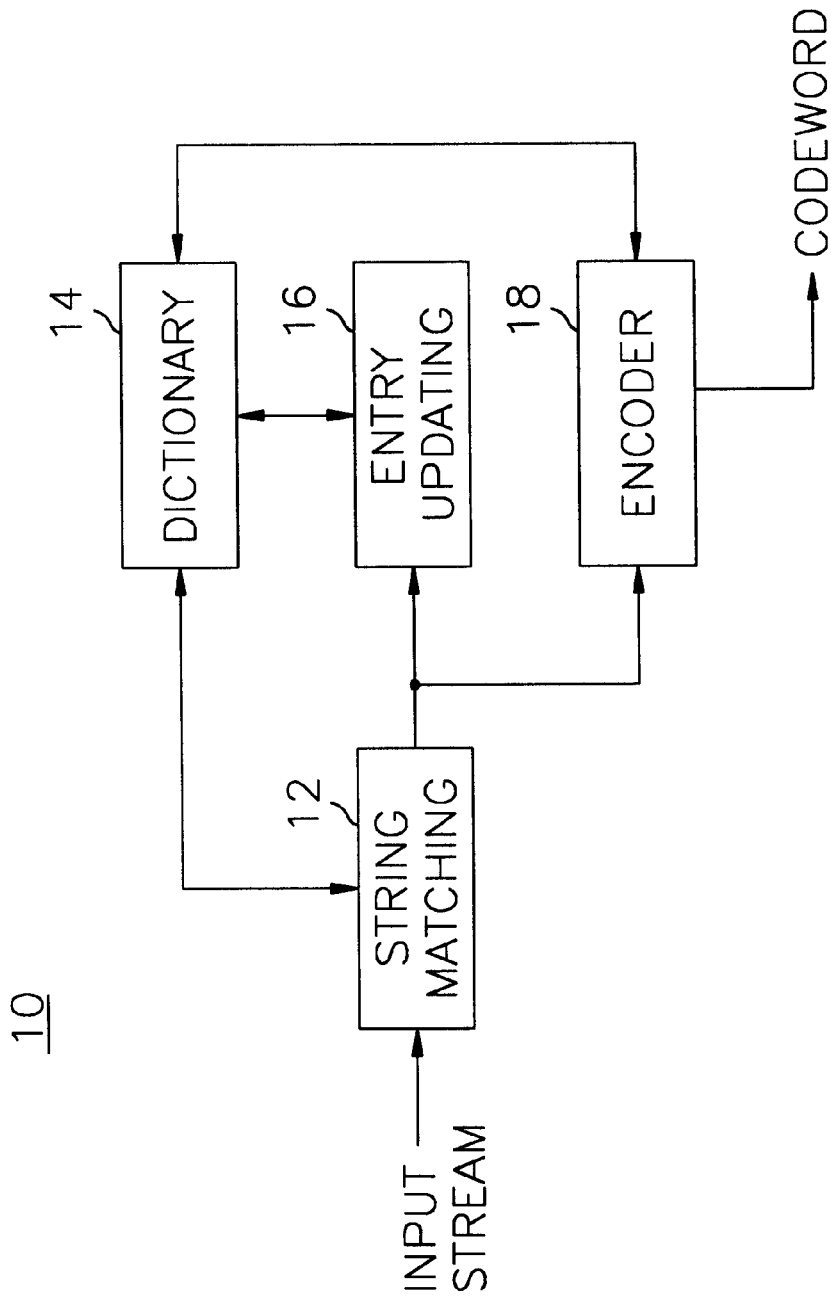
FIG. 1 is a block diagram of an encoding apparatus in a conventional data compression system with dictionary means.
Figure 3:
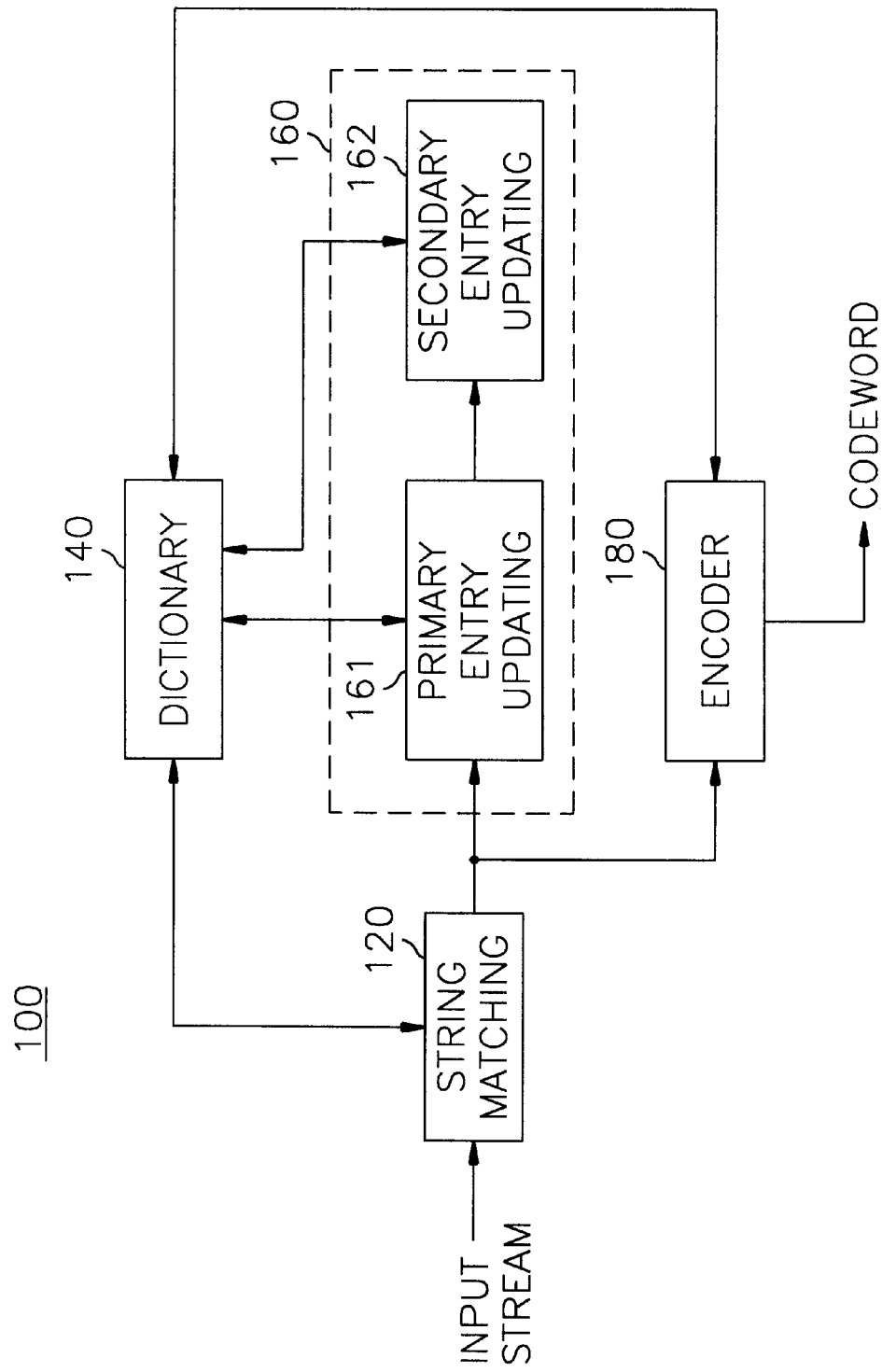
FIG. 3 represents a block diagram of an encoding apparatus in a data compression system in accordance with the present invention.

Referring to FIG. 3, there is illustrated a block diagram of an encoding apparatus 100 used in the data compression system in accordance with the present invention. The encoding apparatus 100 comprises a string matching block 120, a dictionary 140, an entry updating block 160 and an encoder 180.

The string matching block 120 receives an input stream of characters on a character-by-character basis; finds a longest matching string of characters that matches with one of a plurality of entries within the dictionary 140; and stores the longest matching string and an unmatched character, wherein the unmatched character is a character appended to the longest matching string. The string matching block, if necessary, includes two input buffer means for storing the longest matching string and the unmatched character appended thereto, respectively.

The encoder 180 detects a codeword of the entry within the dictionary 140 identified by the longest matching string and transfers the codeword as an output.

In the meantime, the entry updating block 160 updates the dictionary 140 by adding N new entries of characters thereto, wherein all of the N new entries include non-empty suffixes of the longest matching string concatenated with the unmatched character, N being a positive integer equal to the number of characters in the longest matching string, and assigns a new codeword to each of the N new entries. Specifically, the longest matching string with N number of characters is divided on a character-by-character basis to generate N non-empty suffixes, wherein all of the N non-empty suffixes have an end character of the longest matching string. Each of N non-empty suffixes is concatenated with the unmatched character so that the N new entries are made. For example, if the longest matching string and the unmatched character are 'ABCD' and 'A', respectively, 4 non-empty suffixes of 'ABCD', 'BCD', 'CD' and 'D' are generated and, therefore, 4 new entries of 'ABCDA', 'BCDA', 'CDA' and 'DA' are generated.

Further, the entry updating block 160 compares each of the N new entries with the plurality of entries in the dictionary 140 to collect nonexistent new entries, wherein the nonexistent new entries represent some of the N new entries which do not exist in the dictionary 140 and allocates the new codeword for each of the nonexistent new entries. On the contrary, since the others of the N new entries exist in the dictionary 140, the codewords of the others may not be changed except those for the nonexistent new entries so as to obtain the above results.

It is preferable that the entry updating block 160 includes a primary entry updating unit 161 and a secondary entry updating unit 162. The primary entry updating unit 161 updates the dictionary 140 with a primary entry, wherein the primary entry represents a new entry formed by appending the longest matching string itself to the unmatched character. If the longest matching string has two or more characters, the secondary entry updating unit 162 updates the dictionary 140 with secondary entries, wherein each of the secondary entries has a portion of the longest matching string concatenated with the unmatched character Further, the entry updating block 160 may delete some entries of characters from the dictionary 140, so as to provide it with room for the N new entries of characters. It is preferable that the deleted entries are selected among infrequently used entries in the dictionary 140.

Figure 4:
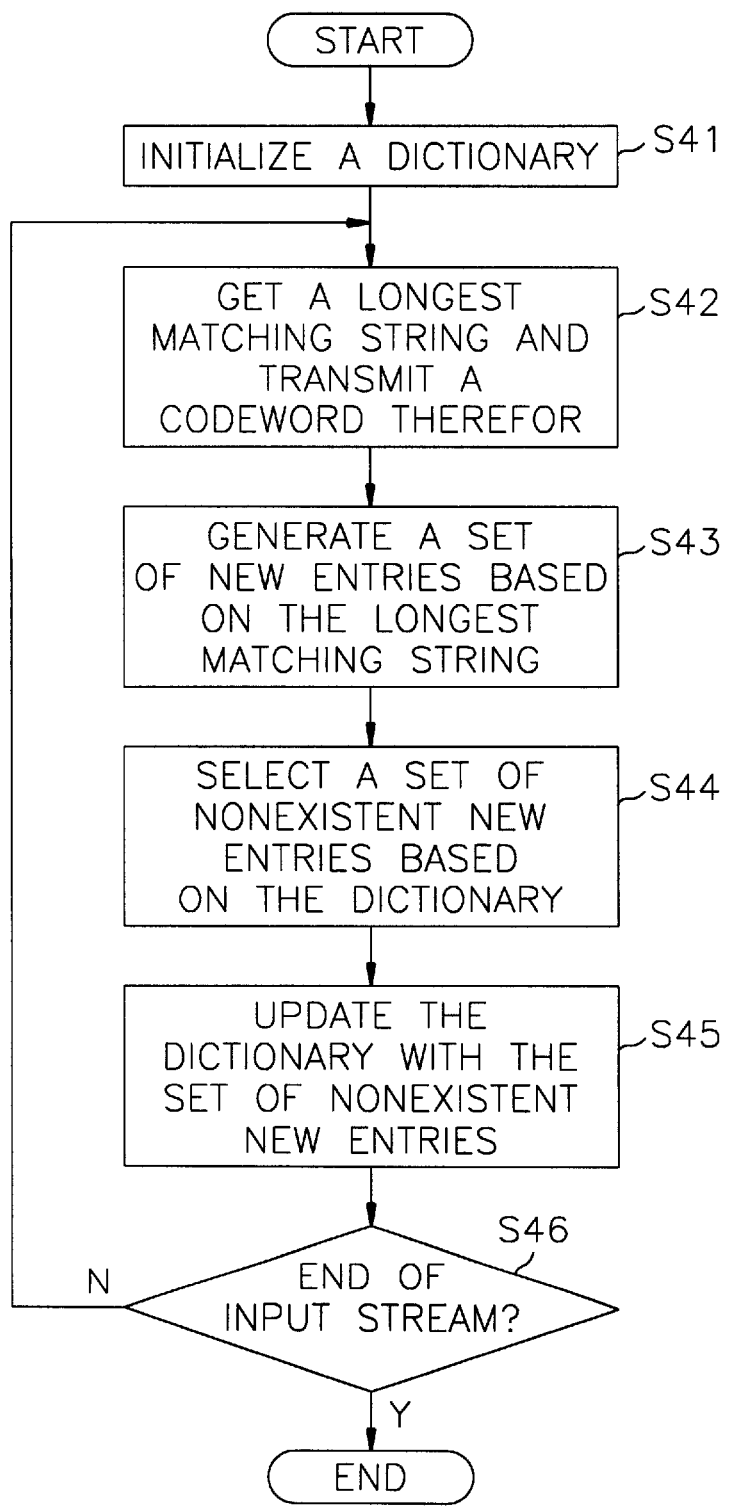
FIG. 4 depicts a flow diagram of a data compression algorithm in accordance with the present invention.

Referring to FIG. 4, there is depicted a flow diagram of a data compression algorithm in accordance with the present invention.

At step S41, the dictionaries at the encoding and the decoding apparatus may be initialized at the beginning to contain identical information with each other, wherein each dictionary is adapted to contain a number of entries of characters and each entry has a unique codeword associated therewith.

At step S42, an input stream of characters is received on a character-by-character basis; a longest matching string of characters that matches with one of a plurality of entries within the dictionary 140 is detected; and the codeword identified by the longest matching string is transmitted as an output.

At step S43, a number of new entries are generated based on the longest matching string. Specifically, the longest matching string with N number of characters is divided on a character-by-character basis to generate N non-empty suffixes, wherein all of the N non-empty suffixes have the end character of the longest matching string. Each of the N non-empty suffixes is concatenated with the unmatched character so that N new entries are made.

At step S44, a set of nonexistent new entries is selected based on the entries of the dictionary. Specifically, each of the N new entries is compared with the plurality of entries within the dictionary 140 to collect the set of nonexistent new entries, wherein the nonexistent new entries represent some of the N new entries which do not exist in the dictionary 140.

At step S45, the dictionary 140 is updated with the set of nonexistent new entries so that a new codeword is allocated for each of the nonexistent new entries. Therefore, the number of nonexistent new entries may be equal to or larger than 0 and equal to or smaller than N. If necessary, some sentries of characters are required to be deleted from the dictionary 140 so as to provide the dictionary with room for the nonexistent new entries. It is preferable that the deleted entries are selected among infrequently used entries in the dictionary 140.

At step S45, it is determined if the end of the input stream arrives and the steps S42 to S45 are repeated until the end of the input stream.

Referring to FIG. 5, there is illustrated a manner by which the longest matching string is encoded and one or more new entries are updated in the data compression system in accordance with the present invention. It is assumed that the dictionary 140 contains characters 'A' to 'Z' with their respective corresponding codewords '0' to '25' as a plurality of entries and an input stream of characters, e.g., 'ABABCBCABCBCAD', is provided. At a 1st level, a first character 'A' of the input stream is matched with a longest matching string 'A' to be encoded as the codeword '0' since the string 'ab' has not been enrolled in the dictionary 140. Thereafter, the string 'AB', which is generated by linking the longest matching string 'A' to the unmatched character 'B', is enrolled as a new entry with the new codeword '26' in the dictionary 140. At a 2nd level, a longest matching string 'B' is encoded with a codeword '1' and a new entry 'BA' is enrolled with a new codeword '27' in the dictionary 140 in a similar manner. At a 3rd level, a longest matching string 'AB' is encoded and two new entries, i.e., both 'ABC' and 'BC', are enrolled with two new codewords '28' and '29', respectively. At next levels, longest matching strings 'C', 'BC', 'ABC', 'BCA' are sequentially encoded while sets of new entries {'CB'}, {'BCA' and 'CA'}, {'ABCB' and 'BCB'} and {'BCAD', 'CAD' and 'AD'} are sequentially enrolled in the dictionary 140. Since a number of entries may be updated in the dictionary 140 from the same input stream, the coding efficiency increases.

While the present invention has been described with respect to certain preferred embodiments only, other modifications and variations may be made without departing from the spirit and scope of the present invention as set forth in the following claims.

What is claimed is:

1. An apparatus for compressing an input stream of characters into a compressed stream of codewords, comprising:

dictionary means for storing a plurality of entries of characters, each entry being identified by a unique codeword;

matching means for parsing said input stream of characters into a number of parsed strings of characters;

encoder for transmitting the unique codeword identifying each parsed string; and update means for adding N new entries of characters to said dictionary means, wherein all of said N new entries include an unmatched character which is appended to said each parsed string, N being an integer larger than or equal to 0, and assigning a new codeword to each of said N new entries, wherein said each parsed string represents a longest matching string possible that matches with one of the plurality of entries of characters, wherein said N new entries include non-empty suffixes of said each parsed string concatenated with said unmatched character, N being equal to the number of characters in said each parsed string and all of said non-empty suffixes having an end character of said each parsed string, wherein said update means includes:
      primary update means for adding said parsed string linked with said unmatched character as a primary entry of said N new entries; and
      secondary update means for adding, if said parsed string has two or more characters, portions of said parsed string linked with said unmatched character as secondary entries of said N new entries.

2. The apparatus as recited in claim 1, wherein said update means further includes:

comparator for comparing each of said N new entries with the plurality of entries in said dictionary means to collect nonexistent new entries which do not exist in said dictionary means; and means for allocating a new codeword for each of said nonexistent new entry.

3. The apparatus as recited in claim 2, wherein said update means includes deletion means for deleting M entries of characters from said dictionary means, M being an integer equal to or larger than 0, so as to provide said dictionary means with room for said N new entries of characters.

4. The apparatus as recited in claim 3, wherein the deleted entries are selected among infrequently used entries.

5. The apparatus as recited in claim 4, further comprising two input buffer means for storing said each parsed string and said unmatched character appended thereto, respectively.

6. A method for compressing an input stream of characters into a compressed stream of codewords by employing dictionary means, wherein the dictionary means stores a plurality of entries of characters, each entry being identified by a unique codeword, comprising the steps of:

(a) parsing said input stream of characters into parsed strings, wherein each parsed string is a longest matching string possible that matches with one of said plurality of entries of characters;

(b) transmitting the unique codeword identifying said each parsed string; and (c) updating N new entries of characters in the dictionary means, wherein all of said N new entries include an unmatched character which is appended to said each parsed string, N being an integer larger than or equal to 0, and assigning a new codeword to each of said N new entries, wherein said N new entries include non-empty suffixes of said each parsed string concatenated with said unmatched character, N being equal to the number of characters in said each parsed string and all of said non-empty suffixes having an end character of said each parsed string, wherein said updating step (c) includes the steps of:
      (c1) comparing each of said N new entries with the plurality of entries in said dictionary means to collect nonexistent new entries which do not exist in said dictionary means; and
      (c2) allocating a new codeword for each of said nonexistent new entries.

7. The method as recited in claim 6, wherein said comparing step (c1) has the steps of:

(c11) updating said parsed string linked with the unmatched character as a primary entry of said N new entries; and (c12) adding, if said parsed string has two or more characters, portions of said parsed string linked with the unmatched character as secondary entries of said N new entries.

8. The method as recited in claim 7, wherein said updating step (c) further includes, after the step (c1), the step of (c3) deleting M entries of characters from said dictionary means, so as to provide said dictionary means with room for said N new entries of characters, M being an integer equal to or larger than 0.

9. The method as recited in claim 8, wherein the deleted entries are selected among infrequently used entries.

* * * * *